United States Patent [19]

Ma

[11] 3,852,670

[45] Dec. 3, 1974

[54] TUNER WITH INTEGRAL INPUT FILTER

[75] Inventor: John Ma, Glenview, Ill.

[73] Assignee: Zenith Radio Corporation, Chicago, Ill.

[22] Filed: Oct. 29, 1973

[21] Appl. No.: 410,937

[52] U.S. Cl. .................. 325/357, 325/363, 325/379, 334/15, 334/85

[51] Int. Cl. .................. H04b 1/18

[58] Field of Search ........... 325/357, 379, 383, 387, 325/363; 334/14, 15, 85

[56] References Cited

UNITED STATES PATENTS

| | | | |
|---|---|---|---|
| 2,962,586 | 11/1960 | Maurer | 325/357 X |
| 3,029,339 | 4/1962 | Pan | 334/15 X |
| 3,299,360 | 1/1967 | Wolfram | 325/357 X |

*Primary Examiner*—Paul L. Gensler
*Attorney, Agent, or Firm*—Nicholas A. Camasto; John J. Pederson

[57] ABSTRACT

A television tuner has a UHF section comprising a stamped metal subchassis having a plurality of resonant circuit elements whose electrical characteristics are adjustable by deforming portions thereof and a thick film integrated circuit VHF section. A metal housing supports the stamped metal subchassis and thick film integrated circuit and a metal shield encloses the stamped chassis and integrated circuit. The thick film integrated circuit includes an RF amplifier, mixer, local oscillatr, and an input filter network which attenuates signals between 88 and 108 MHz as well as those at or near the IF frequency of 45.75 MHz. The input filter network can be aligned while coupled to the RF amplifier input network.

6 Claims, 4 Drawing Figures

TUNER WITH INTEGRAL INPUT FILTER

RELATED PATENTS AND PATENT APPLICATIONS

This application is related to U.S. Pat. No. 3,806,844 issued Apr. 23, 1974 entitled "A UHF VARACTOR TUNER HAVING A CHASSIS OF UNITARY CONSTRUCTION" in the name of John Buckley and John Ma, U.S. Pat. No. 3,818,349 issued June 18, 1974 entitled "THICK FILM VHF TUNER" in the name of John Ma, and application Ser. No. 402,522 filed Oct. 1, 1973 entitled "FEEDTHROUGH CAPACITOR ARRANGEMENTS FOR THICK FILM TUNER" in the name of John Ma. The above patents and application are assigned to the assignee of the present application and disclose separate and distinct inventions having preferred embodiments related to the present invention.

BACKGROUND OF THE INVENTION

Television tuners convert the frequency of a received signal to an intermediate frequency by a heterodyning process. Heterodyning consists of generating an oscillatory signal and applying it, together with a received signal, to a mixer and recovering the resultant difference, or beat frequency signal. By changing the oscillator frequency, received signals of different frequencies over a relatively wide frequency range may be converted to a common desired intermediate frequency.

The specific types of circuitry used in television tuners vary but all tuners include an RF amplifier stage, a variable frequency local oscillator stage, and a mixer stage. In most tuners mechanical switching arrangements selectively interchange different resonant circuit elements for varying the local oscillator frequency (and the resonant frequencies of other tuned stages). In general, tuner performance has been satisfactory but mechanical type tuners require a large number of components and are subject to intermittent mechanical contacts with resultant problems of repeatability, reliability, expense, difficulty of manufacture, and bulkiness.

Recently varactor tuners, which are distinctly different from mechanical tuners, have been gaining acceptance by television manufacturers and the viewing public. These tuners incorporate varactor diode semiconductor devices which exhibit capacity variations with changes in applied DC control voltage. Thus, such tuners not only offer size advantages but are readily controllable by a DC voltage, rather than requiring the interchange of elements in resonant circuits.

From a manufacturing point of view, it is highly desirable that the characteristics of tuners be repeatable, that is, that each tuner be similar in performance. Because of the high frequency of the signals processed by tuners, the spacing of components and wiring is critical and variations therein may produce gross variations in tuner characteristics. Close spacing of discrete circuit components also may produce undesirable signal coupling which increases the probability of spurious resonances and interferences which degrade performance.

The size problem is not as serious as the others although it is desirable to make a tuner compact to minimize the distances over which the low level high frequency signals must be translated. Also from a packaging point of view, a compact unit is much to be preferred and yields numerous advantages to the television stylist.

Tuner reliability is, of course, directly related to the number of components used, as is true of component cost and overall tuner size. Further, manufacturing difficulty increases with an increased number of components.

The above-mentioned U.S. Pat. No. 3,818,349 discloses a tuner, which is compact, rugged, easy to manufacture, and of repeatable characteristics. The tuner incorporates a ceramic based thick film integrated circuit VHF section and an all metal stamped UHF section. The thick film integrated circuit consists of a nonconductive substrate upon which a plurality of resistive and capacitive components and conductive interconnections are formed by resistive, conductive and dielectric materials deposited in a layer-like manner. The above tuner also includes a number of discrete circuit elements mounted to the substrate in conventional printed circuit fashion.

Because television tuner circuits process high frequency signals at low signal levels and generally exhibit high signal gains, they are necessarily very sensitive and susceptible to oscillation and interference problems. It is thus common practice to enclose the circuitry within an electro-magnetically shielded housing and connect the control and operating voltage leads to the circuitry through feed-through capacitors for filtering any high frequency signals present on the leads. The above-related application Ser. No. 402,522 discloses a novel thick film integrated circuit feed-through capacitor which in combination with the thick film integrated circuit of the above-mentioned U.S. Pat. No. 3,818,349 performs the required high frequency filtering and is both economical and easy to manufacture.

The band of frequencies assigned for VHF television broadcast is segmented, or interrupted, by bands of frequencies assigned to non-television functions. The low VHF band (54 to 72 MHz) contains channels 2 through 4, the mid VHF band (76 to 88 MHz) channels 5 and 6, and the high VHF band (174 to 216 MHz) channels 7 through 13. There exists a 4 MHz spacing between the low and mid bands and an 86 MHz spacing between the mid and high bands. Accordingly, television tuners, in addition to processing received television signals, must also be capable of excluding undesired signals. This exclusion is two-fold and generally requires 1) shielding the tuner from airborne signals and 2) filtering of the received signals to remove undesired signals. Shielding the tuner from airborne signals in general is accomplished by surrounding it with a metal housing which is connected to a source of ground potential. Filtering is generally accomplished by an input filter network, interposed between the receiving antenna and the RF amplifier of the tuner, containing resonant circuits to attenuate undesired signals.

While any undesired signal is likely to cause interference, of particular concern are those signals resulting from FM broadcasts (88 to 108 MHz) and locally generated intermediate frequency signals 41 to 47 MHz. Because components used have variations within tolerance limits, selective rejection of signals within the above-mentioned bands requires that the input filter be aligned by adjustment of its resonant frequencies to attenuate signals sought to be rejected.

During manufacture, the tuner and input filter network are separately constructed, the filter is aligned and subsequently assembled to the tuner which is then aligned. The filter is connected to a terminating load together with a detector and driven by a sweep signal applied to the filter input. The sweep signal consists of a constant amplitude sinusoidal voltage varying in frequency between frequencies below and above those of interest in the alignment (typically 39 to 49 MHz for IF and 86 to 110 MHz for FM). Since the input sweep signal is of constant amplitude, any changes observed at the load are indicative of the frequency response of the filter. In addition to the variable frequency sinusoidal voltage, the sweep signal contains frequency markers usually comprising short duration signals which indicate the frequencies corresponding to particular points on the observed signal. Generally a marker is made available at each of the frequencies to which a variable inductance coil is to be adjusted. The alignment of the filter consists of centering each response about its designated marker by "knifing" or deforming the appropriate coil to vary its inductance. The terminating load is then removed and the separately aligned filter is assembled to the tuner for tuner alignment. This separate manufacture and alignment of the filter and tuner increases the difficulty and costs of manufacture and precludes unitary construction.

OBJECTS OF THE INVENTION

Accordingly, it is an object of the present invention to provide an improved television tuner.

It is a further object of the present invention to provide a television tuner having an input filter network which can be aligned while coupled to the RF amplifier.

SUMMARY OF THE INVENTION

A television tuner includes an RF amplifier, a mixer, and a local oscillator having variable reactance circuit components for adjusting their resonant frequencies. An input filter network couples the received signal to the RF amplifier and attenuates signals within a predetermined band of frequencies. The input filter network, RF amplifier, mixer, and local oscillator stages are enclosed within a shielded housing and alignment of the filter is accomplished without disturbing its coupling to the RF amplifier. Preferentially all components of the tuner and filter are present on a common substrate. Alignment is performed by adjusting the reactance of the RF amplifier input to provide a substantial load on the filter network at the frequencies of interest to enable observation of the sweep waveforms used.

BRIEF DESCRIPTION OF THE DRAWINGS

The features of this invention which are believed to be novel are set forth with particularity in the appended claims. The invention, together with its further objects and advantages, may best be understood by reference to the following description taken in conjunction with the accompanying drawings in the several figures of which like reference numerals refer to like elements and in which:

DETAILED DESCRIPTION OF THE PREFERRED EMBODIMENT

While the present invention is primarily concerned with the input filter network in combination with the VHF section of the tuner, a better understanding thereof will be had by initially describing the features of the novel combination tuner, including a stamped metal UHF section and a thick film VHF section, which are the subjects matter of others of the above copending applications. The FIGS. 1 and 2 showings constitute the preferred implementation of the present invention.

Figure 1:
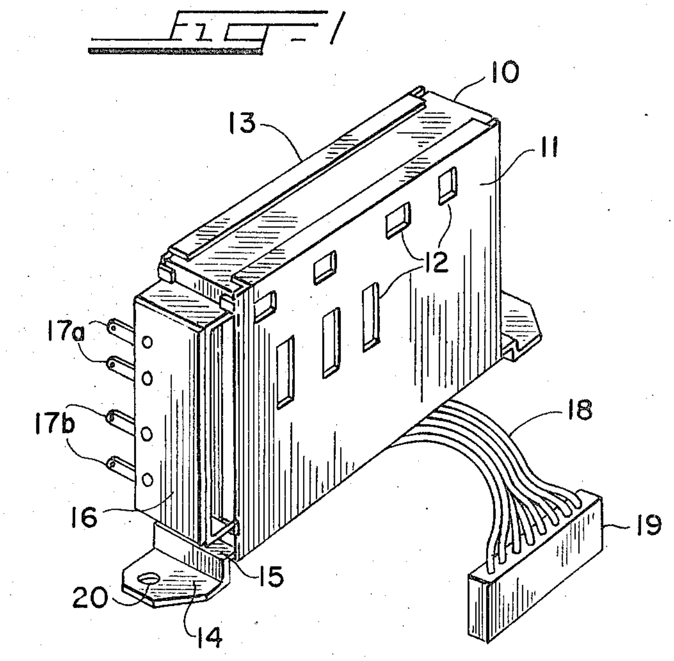
FIG. 1 shows a perspective view of a television tuner constructed in accordance with the disclosed invention.
Figure 2:
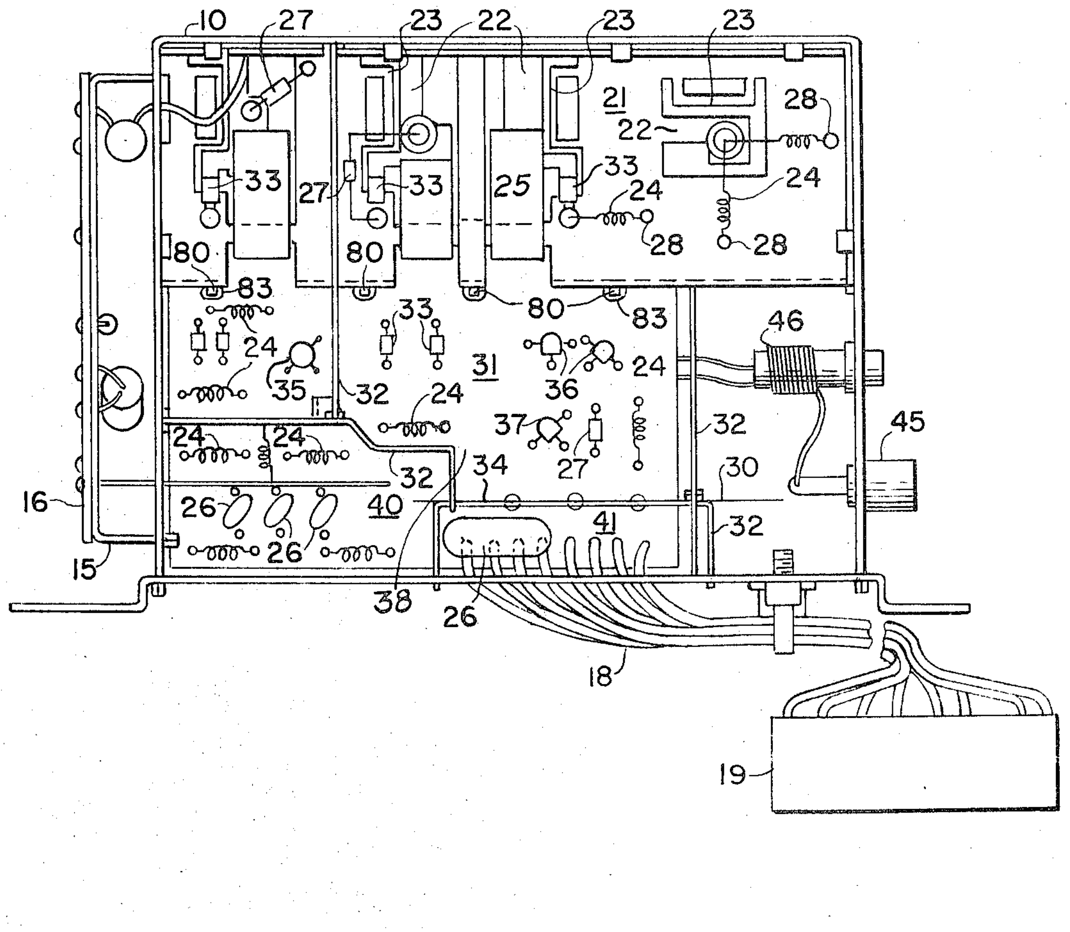
FIG. 2 is a view of the tuner with one cover shield removed to show the stamped UHF section and the discrete component side of the substrate VHF section.

Referring to FIG. 1, a generally rectangular metal housing 10, supporting tuner circuitry (not shown), includes a pair of mounting flanges 14 having mounting holes 20. A cover 11 of suitable electro-magnetic energy shielding properties encloses one side of housing 10. Cover 11 has a plurality of access holes 12 permitting adjustment of the enclosed tuner circuitry. Another shielding cover 13 encloses the opposite side of housing 10 and may also contain access holes similar to those in cover 11. An input terminal bracket 15 is mounted to housing 10 and supports an input terminal circuit board 16. Two sets of input terminals, 17*a* and 17*b*, suitable for connection to sources of UHF and VHF television signals together with input antenna balun coils (not shown) are mounted to the circuit board. The circuit board may include printed conductive connections and may also include printed type balun coils.

The enclosed tuner circuitry includes an input filter network, together with an RF amplifier stage, a mixer stage, and a local oscillator stage. The input filter network reduces any information present in the received signal which is within a predetermined band of frequencies, before coupling it to the RF amplifier for amplification. While the input filter network may be used to reduce information at any frequency which would result in interference, it is of particular advantage to reduce signals at the IF frequency and at those frequencies within the FM band. The local oscillator supplies its signal to the mixer which also receives the amplified radio frequency signal and produces the desired IF frequency signal by the familiar heterodyning action. An interstage transformer is generally included for reducing the source impedance of the mixer and for coupling the IF signal to an output connector. The resonant frequencies of the RF amplifier, mixer and local oscillator stages are adjusted to tune the selected television broadcast signal by applying appropriate DC control voltages to the respective varactor diode-tuned resonant circuits within these stages. A plurality of lead wires 18 connect to the tuner circuitry in housing 10 for supplying the control voltages to the varactor diodes and operating potentials to the tuner. The wires terminate in a suitable connecting plug 19 for facilitating use of the tuner with a television receiver (not shown).

It will be recognized that the entire VHF-UHF tuner is enclosed and shielded by housing 10 and covers 11 and 13. In particular, those skilled in the art will note that the input filter network was recited as being within housing 10 whereas the practice in the past has been to incorporate a separate shielded input filter network because of the need to separately align the filter (on the production line) apart from the tuner. It will be evident to those skilled in the art that the instant invention may be practiced without the inclusion of the UHF section within the shielded housing.

As shown in FIG. 2, a stamped metal UHF subchassis 21 forms a plurality of adjustable tuned elements, the electrical characteristics of which may be varied by deforming certain portions of subchassis 21. Subchassis 21 is the subject of the referent application to Buckley and Ma which discloses a unitary stamped, essentially planar, metal structure forming transmission inductors, capacitors and tunable inductive shunts. The capacitors comprise tabs which are bent to an overlying position in close proximity to the chassis plane, the resulting capacitance being a function of the tab area and distance from the chassis plane. The capacitor is "trimmable" by changing the tab spacing. The transmission inductors comprise essentially straight elements cut in the subchassis and tunable inductive shunts of generally smaller U-shaped portions of the subchassis adjacent the straight elements. The inductance is changed by bending the inductive shunt thus changing its positioning with respect to the straight elements.

For example, capacitor 25 is adjustable by moving its upper plate closer to or farther from the corresponding opposite plate formed in the subchassis. Similarly, the inductances of inductors 22 are varied by changing the proximity of their respective adjacent shunts 23. These adjustments can be made through the access holes in the tuner covers. A plurality of discrete circuits component including inductors 24, capacitors 26, resistors 27 and varactor diodes 33 are mounted to subchassis 21 by solder connections and coact with the stamped circuit elements.

A VHF thick film integrated circuit 31 includes an alumina substrate 38 which supports a number of discrete circuit components 24, 26 and 27 together with a plurality of varactor diodes 33, and an RF amplifier stage including a transistor 35, a mixer stage including a pair of transistors 36, and a local oscillator stage including a transistor 37. The thick film components of the VHF section are on the underside of substrate 38 and not visible. The RF amplifier and mixer stages are positioned near the inner edge of UHF subchassis 21.

The thick film resistive and capacitive components, together with their interconnections or conductive elements, are formed by depositing appropriate layers of conductive, resistive and dielectric material in predetermined patterns on an alumina substrate. For example, a resistor is formed by a deposited layer of resistive material connecting two areas of conductive material and a capacitor is formed by alternating layers of conductive material, which define plates, with a layer of dielectric material. The circuit components thus formed are connected to other circuit components by conductive elements. As discussed in detail in the above-mentioned U.S. Pat. No. 3,818,340, a portion of substrate 38 beneath the UHF subchassis supports a deposited metal ground plane for the VHF circuitry and an external ground element is coupled to the deposited metal ground plane. Also, as fully discussed in that application, the ceramic substrate is extremely brittle and susceptible to mechanical and thermal shock damage and attachments thereto are resiliently made to allow slight pivoting movements of the substrate under shock conditions.

An isolation shield 32 having a number of segmenting portions is used to reduce coupling between adjacent circuit areas, and is electrically and mechanically connected to the tuner housing. The shield defines a plurality of electrically isolated cavities housing the input filter network 40, the RF amplifier stage, the mixer and local oscillator stages, the interstage transformer 46, and feed-through input connection 41. The UHF subchassis is connected electrically and mechanically to the VHF thick film circuit by a plurality of mounting fingers 80, which extend through holes 83 in substrate 38 which are soldered to the conductive material ground plane on the bottom of the substrate.

For reasons of economy, the shield and UHF subchassis are preassembled to the thick film circuit along with the discrete components and the substrate and components are preheated to prevent large temperature gradients. Since the side of the substrate bearing the deposited thick film circuit elements is subjected to the solder, it is covered with a glass seal having a number of layers of slightly different expansion coefficients. A portion 34 of segmenting shield 32 has a number of linearly arranged connection points attaching the shield to substrate 38 which points define hinge line 30 and together with fingers 80 support substrate 38 within housing 10.

Figure 3:
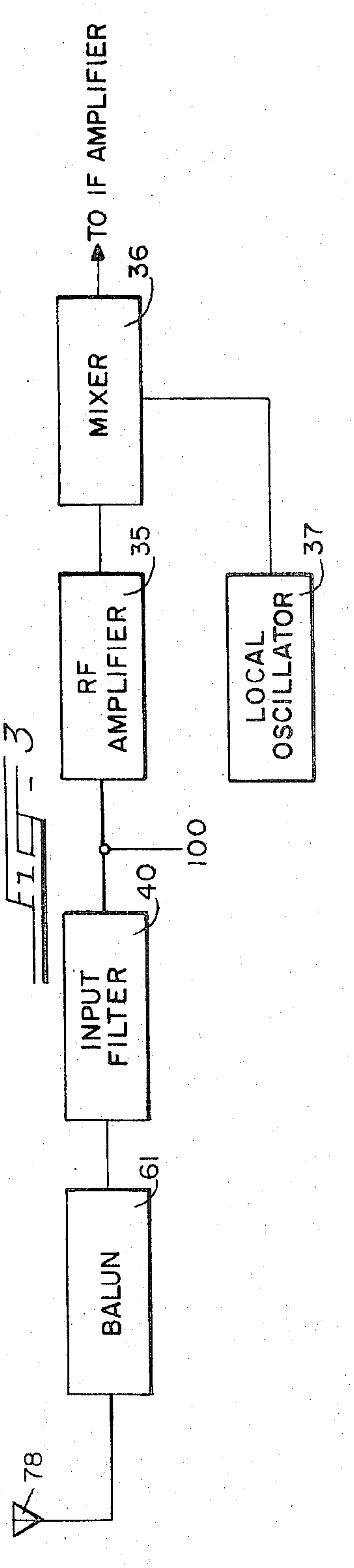
FIG. 3 is a block diagram representation of the circuitry in the disclosed tuner.

The novel combination tuner briefly described above including the input filter network presents a most desirable tuner having advantages which are best understood by turning to the block diagram representation of the VHF section of the above-described tuner shown in FIG. 3. A signal incident upon antenna 78 is coupled by an input balun 61 to input filter 40. Input filter 40 selectively attenuates undesired signals and couples the remaining signals to RF amplifier stage 35 and includes filter sections (shown in FIG. 4) for reduction of both FM and IF signals. RF amplifier 35 and local oscillator 37 couple signals to a mixer stage 36 which converts the received signal to a signal at the intermediate frequency suitable for application to the IF amplifiers of a television receiver (not shown).

Figure 4:
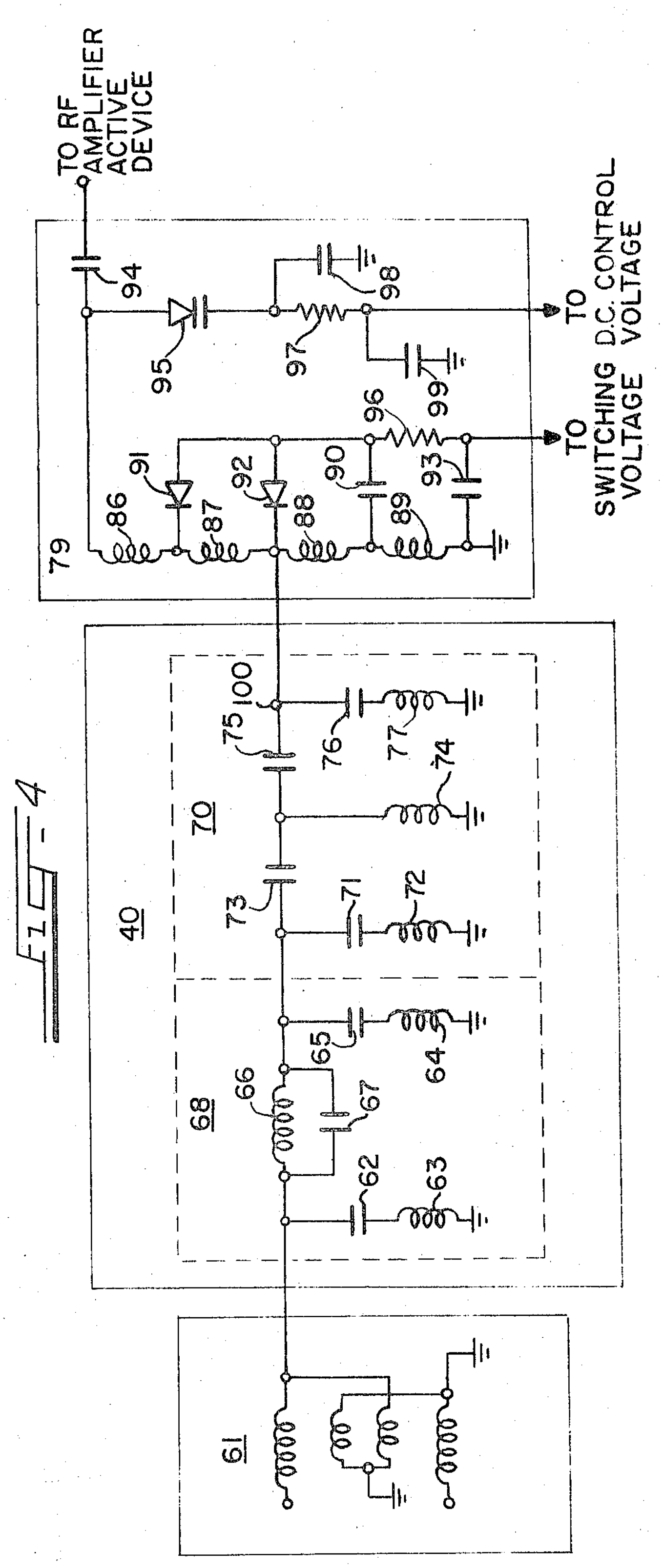
FIG. 4 is a schematic diagram of a portion of the tuner showing the details of the input filter and associated circuitry.

FIG. 4 shows a schematic diagram of a portion of the tuner circuit represented in FIG. 3, namely balun 61, filter network 40 and the input circuit of RF amplifier 35. Input filter network 40 comprises an FM section 68 and an IF section 70 as indicated in dashed outline. The output of balun 61 is coupled to FM filter 68 which is a pi type network having a series combination of an inductor 63 and a capacitor 62 coupling the input to ground, a parallel combination of an inductor 66 and a capacitor 67 coupling the signal to IF section 70 and a series combination of a capacitor 65 and an inductor 64 coupling the other side of the parallel combination to ground. IF section 70 includes a T network comprising a pair of series connected capacitors 73 and 75 coupling the signal from FM section 68 to a transformer 79 (in the input circuit of RF amplifier 35) and an inductor 74 coupling their junction to ground.

The input side of the T network is coupled to ground through a series connected capacitor 71 and an inductor 72. The output side defines a test point 100 and is coupled to ground through a series connected capacitor 76 and an inductor 77. Transformer 79 comprises a series array of inductors 86, 87, 88 and 89 connected between ground and the anode of an extended range varactor diode 95 which has its cathode coupled through a resistor 97 to a source of DC control voltage. Filter capacitors 98 and 99 couple each side of resistor 97 to ground. The output of IF filter section 70 (test point 100) is coupled to the junction of inductors 87 and 88. A source of switching voltage is coupled to ground by a filter capacitor 93 and through a resistor 96 to the anodes of a pair of diodes 91 and 92, having cathodes connected to opposite ends of inductor 87. A capacitor 90 couples the common anodes to the junction of inductors 88 and 89. The output point of transformer 79, which is the junction of inductor 86 and the anode of varactor diode 95, is coupled by capacitor 94 to the active device (not shown) in RF amplifier 35.

The resonance of transformer 79 is adjusted to facilitate reception of the viewer selected channel by variation of the DC voltage applied to extended range varactor diode 95, which as mentioned, exhibits capacity variation responsive to variations in applied DC voltage. As can be seen, diodes 91 and 92 conduct upon the application of a sufficiently positive voltage at their anodes and effectively short out, or remove the reactance of, inductor 87 in transformer 79. This shorting out of inductor 87 is used to accomplish "bandswitching" the process in which the resonant frequency of a transformer (in this case, transformer 79) is changed to accomodate the large frequency differences between the discontinuous bands in the television spectrum, for example, the middle band and high band of VHF television signals. Varactor diode 95 is a type No. BB109 which has an extended capacity range, typically 20 percent greater than the commonly used type No. BB106 varactor diodes, permitting a continuous change in DC control voltage during bandswitching thereby removing the need to overlap control voltages from channels in the low bands to those in the high bands. In the absence of a positive switching voltage, transformer 79 presents its highest inductance.

Filter 40 is aligned by applying a sweep signal to balun 61 and observing the amplitude variations at test point 100. During alignment of filter 40 the signal at test point 100 is developed across the impedance presented by the input circuit of the RF amplifier 35. The tuner channel selector is placed in a low band channel position thereby using the maximum inductance of transformer 79 (that is, no switching voltage applied to diodes 91 and 92) and a DC voltage is applied to extended range varactor 95 sufficient to resonate transformer 79 at a frequency slightly above the frequency of interest, and thereby properly terminate the filter section to permit alignment for example, 120 MHz for FM alignment and 50 MHz for IF alignment. Each variable inductance within the filter sections is adjusted in a manner similar to that discussed earlier, namely, by deforming or "knifing" the coils to center each response about its designated marker.

Thus the input filter in combination with the tuner is aligned without interruption of the coupling between the filter and the RF amplifier and no additional, or dummy, load is required.

While a particular embodiment of the present invention has been shown and described, it will be obvious to those skilled in the art that various changes and modifications may be made without departing from the invention in its broader aspects. Accordingly, the aim in the appended claims is to cover all such changes and modifications that may fall within the true spirit and scope of the invention.

What is claimed is:

1. A television tuner for converting the frequency of a received signal to an intermediate frequency, said tuner comprising:

a shielded housing;

an RF amplifier, a mixer and a local oscillator stage in said shielded housing each including tuned circuit components having variable reactance, for adjusting the resonant frequencies of said stages;

an input filter network in said shielded housing, coupling the received signal to said RF amplifier, and reducing the levels of signal frequencies within a predetermined band of frequencies; and means, including an RF amplifier input network, permitting alignment of said input filter network while coupled to said RF amplifier stage by altering the impedance of said RF amplifier input network to terminate said filter network, for signals within said band of frequencies, in an impedance suitable for alignment of said filter.

2. A television tuner as set forth in claim 1, wherein said RF amplifier input network includes:

a transformer coupling the output of said filter network to said RF amplifier stage; and means for resonating said transformer to provide said suitable impedance.

3. A television tuner as set forth in claim 2, wherein said means for resonating includes:

a varactor diode, coupled to said transformer, having a capacitive reactance which varies as a function of applied DC voltage.

4. A television tuner as set forth in claim 3, wherein said input filter network includes:

an FM filter having a plurality of adjustable resonant circuit elements reducing the levels of signals between 88 and 108 MHz; and an IF filter having a plurality of adjustable resonant circuit elements reducing the levels of signals at said intermediate frequency.

5. A television tuner as set forth in claim 3 wherein said RF amplifier, mixer and local oscillator stages together with said input filter network and said means for aligning are combined on an insulating base.

6. A television tuner as set forth in claim 5 wherein said insulating base comprises an alumina substrate.

* * * * *